(12) United States Patent
Li et al.

(10) Patent No.: US 7,807,573 B2
(45) Date of Patent: Oct. 5, 2010

(54) LASER ASSISTED CHEMICAL VAPOR DEPOSITION FOR BACKSIDE DIE MARKING AND STRUCTURES FORMED THEREBY

(75) Inventors: Eric Li, Chandler, AZ (US); Sergei Voronov, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/284,094

(22) Filed: Sep. 17, 2008

(65) Prior Publication Data

US 2010/0065971 A1  Mar. 18, 2010

(51) Int. Cl.
*H01L 21/44* (2006.01)
(52) U.S. Cl. ............... 438/680; 438/106; 438/681; 257/E21.006; 257/E21.17; 257/E21.324; 257/E21.327; 257/E21.328; 257/E21.347; 257/E21.475; 257/E21.547

(58) Field of Classification Search ............... 438/106, 438/121, 462, 463, 680, 681, 683, 685, 687, 438/746; 257/E21.006, 17, 324, 327, 328, 257/347, 475, 547
See application file for complete search history.

(56) References Cited

U.S. PATENT DOCUMENTS

| 6,172,454 | B1 * | 1/2001 | Hofmann | 313/495 |
|---|---|---|---|---|
| 6,530,649 | B1 * | 3/2003 | Pan | 347/56 |
| 6,744,114 | B2 * | 6/2004 | Dentry et al. | 257/532 |
| 7,166,493 | B2 * | 1/2007 | Dentry et al. | 438/106 |

* cited by examiner

*Primary Examiner*—David Nhu
(74) *Attorney, Agent, or Firm*—Kathy J. Ortiz

(57) ABSTRACT

Methods of forming a microelectronic structure are described. Embodiments of those methods include forming an identification mark on a portion of a backside of an individual die of a wafer by utilizing laser assisted CVD, wherein the formation of the identification mark is localized to a focal spot of the laser.

11 Claims, 4 Drawing Sheets

LASER ASSISTED CHEMICAL VAPOR DEPOSITION FOR BACKSIDE DIE MARKING AND STRUCTURES FORMED THEREBY

BACKGROUND OF THE INVENTION

Microelectronic wafer structures, such as silicon wafer structures, for example, may comprise a plurality of die. Typically these die may be unmarked, thus it tends to be difficult to identify/distinguish individual die from each other for analysis purposes. For example, during a pick and/or place process, analysis of the individual die reliability data would be helpful. Various die identification methods have been used, such as correlating tape and reel locations for a particular bin of die, for example, but such methods can provide relatively low accuracy of correlation.

BRIEF DESCRIPTION OF THE DRAWINGS

While the specification concludes with claims particularly pointing out and distinctly claiming certain embodiments of the present invention, the advantages of this invention can be more readily ascertained from the following description of the invention when read in conjunction with the accompanying drawings in which:

DETAILED DESCRIPTION OF THE PRESENT INVENTION

Figure 1A:
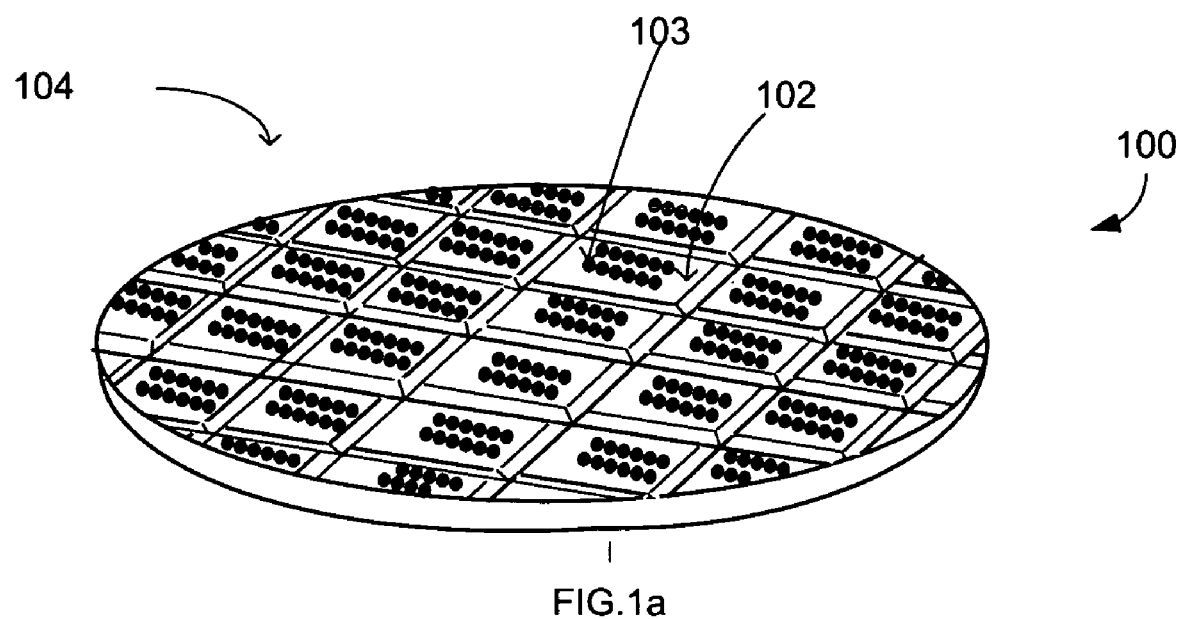
FIGS. 1a-1f represent methods of forming structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming a microelectronic structure, such as a marked die structure, are described. Those methods may comprise forming an identification mark on a portion of a backside of an individual die of a wafer by utilizing laser assisted (chemical vapor deposition) CVD, wherein the formation of the identification mark is localized to a focal spot of the laser. Methods of the present invention enable a process for marking the backside of a die/wafer for highly accurate, unit level traceability (ULT) purposes.

FIGS. 1a-1f illustrate embodiments of methods of forming a microelectronic structure, such as a marked die structure, for example. FIG. 1a illustrates a wafer 100, which may comprise a silicon wafer, for example. In one embodiment, the wafer 100 may comprise a least one die 102, as are known in the art. The die 102 may comprise such circuit elements 103 as transistors, resistors, inductors, capacitors, dielectric layers and interconnection structures, such as bonding pads and/or bumps, for example. In one embodiment, the wafer 100 may be any such substrate that may be associated with a microelectronic device. The wafer 100 may comprise a front side 104.

Figure 1B:
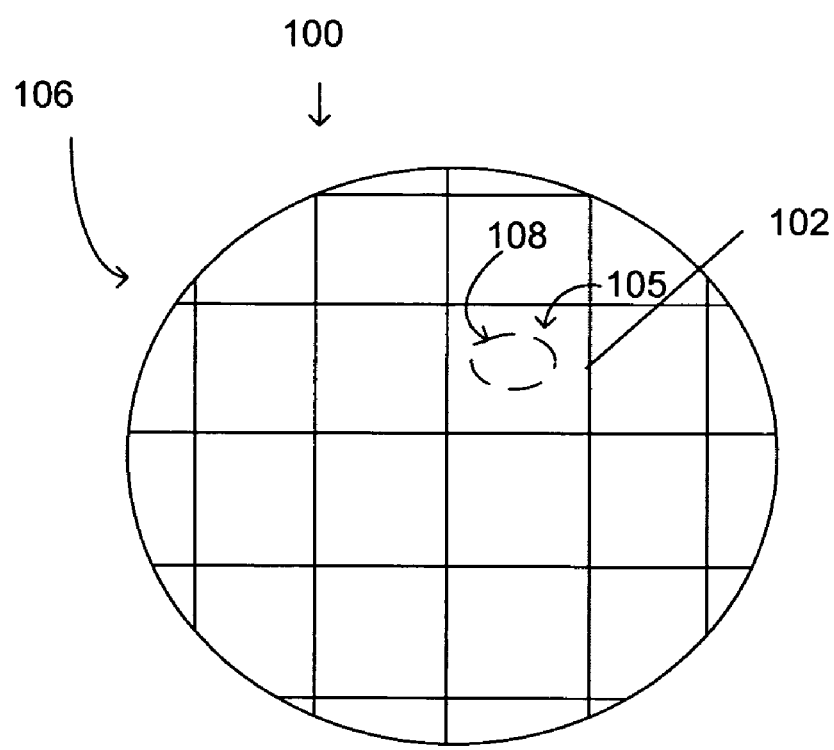

In one embodiment, the wafer 100 may also comprise a back side 106 (FIG. 1b). The back side 106 of the wafer may comprise a backside 105 of an individual one of the at least one die 102, wherein the backside 105 of an individual die 102 may comprise a location 108. It is to be understood that the backside 106 of the wafer 100 comprises a plurality of die and each of those die comprise a backside portion. The location 108 may be a location wherein an identification mark may be subsequently placed according to the various embodiments of the present invention described herein. The placement/location of the location 108 on the backside 105 of the die 102 may vary depending upon the particular application.

Figure 1C:
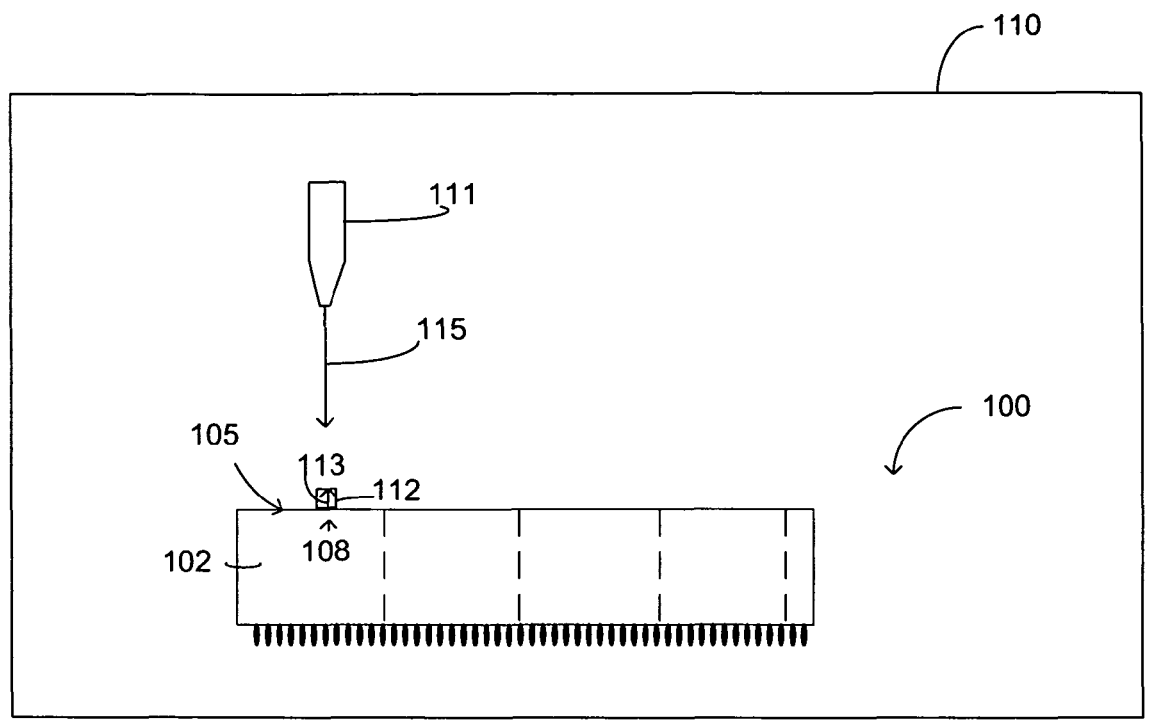

The wafer 100 may be placed in a laser assisted CVD chamber 110, for example, wherein a laser 111 may be used to form and guide the location 108 of the formation of a laser assisted CVD metallic thin film 112 on the backside 105 of the wafer 100 (FIG. 1c). In the laser assisted CVD technique, a laser beam 115 may be interacted with a reactive gas mixture that may be present in the chamber 110. In an embodiment, thin film deposition occurs either by direct bond breaking in the precursors due to optical absorption of the optical energy or by thermal decomposition of the reactive molecules of the reactive gas mixture at or near the surface of the substrate (backside of the wafer 100, for example) heated by the laser beam 115.

The laser 111 provides the energy source for the necessary chemical reaction needed for the metallic film 112 formation on the backside 105 of the die 102. In an embodiment, thin film deposition occurs only around the focusing spot of the laser beam 115 (i.e. only on the location 108) and nowhere else, and thus the laser heating effect is localized. In an embodiment, deposition of a high quality titanium nitride thin film may be formed on the backside 105 of the die 102, wherein the die may comprise silicon and silicon oxide surfaces, and may be formed under low temperatures (less than about 200 degrees Celsius) by utilizing the laser assisted CVD techniques.

In an embodiment, precursors such as but not limited to tetrakis(dimethylamido)titanium (TDMAT) and ammonia assisted by a 193 nm ArF excimer laser may be used to form the metallic thin film 112. In an embodiment, the metallic thin film 112 may comprise such metals as titanium nitride, aluminum and copper, for example. In an embodiment, the identification mark may comprise a contrast region with a backside coating that may be present on the backside of the die, wherein the contrast may facilitate ULT readability. In an embodiment, a thickness 113 of the metallic thin film 112 may comprise about 10 nm to about 1 micron. In an embodiment, the thin metallic film 112 may comprise any material that may provide contrast with the backside surface of the die/wafer.

The metallic thin film 112 deposition is limited to the area around the focusing spot (location 108) of the laser 111 and the heat effect is confined to the localized area 108 as well. In an embodiment, the metallic thin film 112 may be formed by using a set of scanning mirrors to guide the laser beam 115 across the surface of the backside of the wafer 100, wherein the metallic thin film 112 can be formed along pre-defined locations 105 for unique marking/identification marking purpose. Other methods of guiding the laser 111 may be employed according to the particular application, and multiple lasers may be used as well.

Figure 1D:
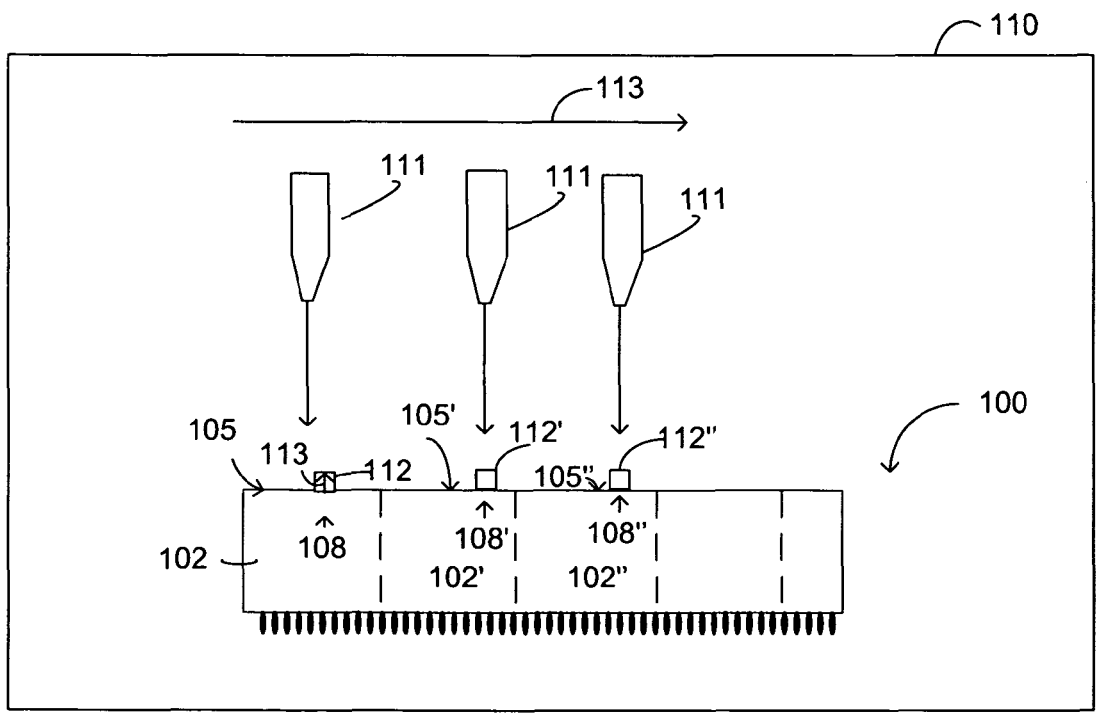
Figure 1E:
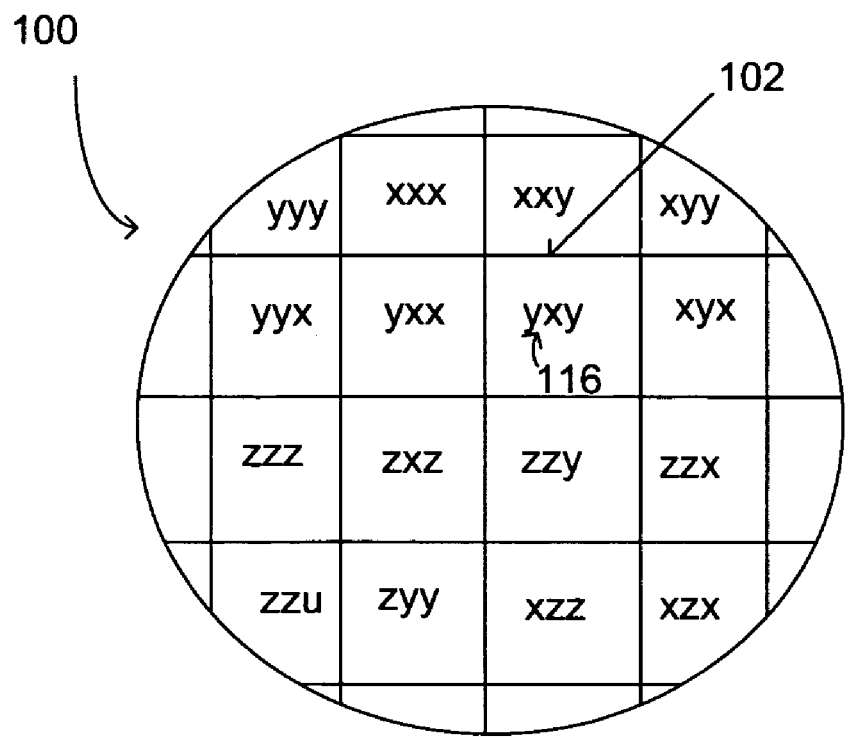
Figure 1F:
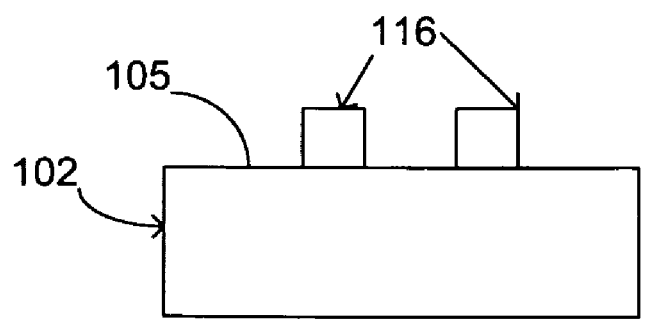

In an embodiment, the laser 111 may be guided 113 to a second location 108' located on an adjacent backside 105' of an adjacent die 102', and then may be guided 113 to another die 102" backside 105" and so on (FIG. 1*d*). In this manner, the metallic thin film 112 may be used to mark the backsides 105, 105', 105" of dies 102, 102', 102" to create unique marks 112, 112', 112" on the backsides of the dies 102, 102', 102" of the wafer 100. In an embodiment, the metallic thin film 112 may be formed to create unique markings/identification marks 116 on the backsides of substantially all of the plurality of die 102 located within the wafer 100 (FIG. 1*e*). The unique markings 116 may be placed/guided by the laser 111 onto the backside of each die 102 according to the particular application. Each identification mark 116 of each die 102 can be distinguished from one another, and thus may be used to enable a die level/unit level traceability (ULT) throughout an entire assembly process, for example.

The methods of the present invention utilize an additive process to fabricate die identification marks, wherein die stress is not impacted, and wherein the die identification marking by the laser assisted CVD chemical reaction is limited by predetermined locations on the backside of the die/wafer, and wherein other areas on the wafer are not marked, since the laser is location specific in guiding where the metallic thin film will be formed. The laser assisted CVD process may be performed at a low temperature of formation, such as below about 200 degrees Celsius in some embodiments, for example, and so is compatible with back end processing of the die/wafer. Each die of the wafer may comprise a permanent identification mark, thus enabling true ULT.

Figure 2:
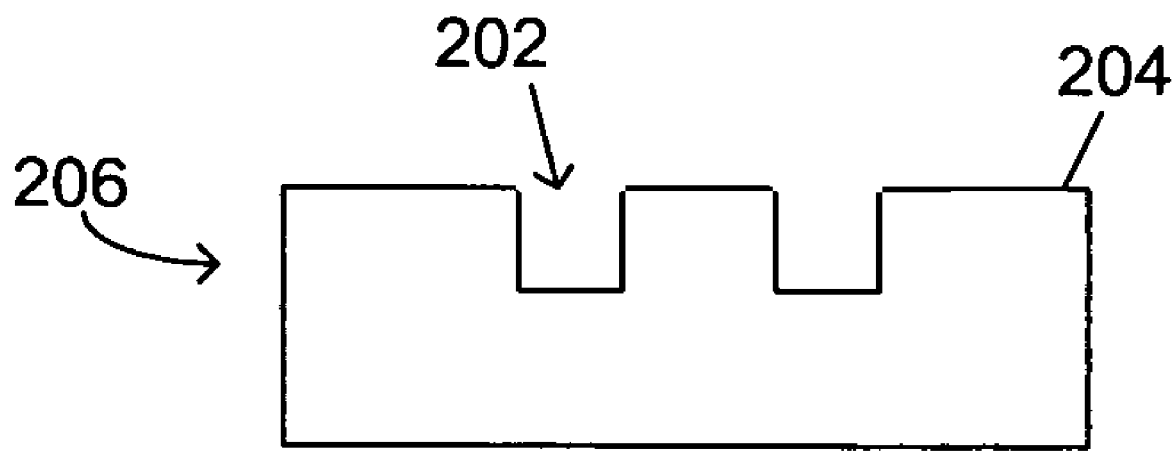
FIG. 2 represents a structure from the Prior Art.

Prior art die identification marking processes may utilize a subtractive process, wherein the marking of the backside surface may result in a groove 202 being formed in a backside 204 of a die 206 (FIG. 2), such as from the use of a laser marking/etching technique, for example. The various embodiments of the present invention enable the formation of unique markings/identification marks 116 that are additive to the backside 105 of the die 102, thus impact to die stress is minimized (referring back to FIG. 1*f*).

The methods of the various embodiments also are applicable for thin wafers (for example, wherein a wafer comprises from about 25 microns to about 775 microns in thickness, and wherein a full thickness of a non-thinned wafer may comprise about 770 microns to about 775 microns, for example). In prior art ULT methods of non-thinned wafers, ULT may be provided by matching the lot number to the bin number of the die and by matching the wafer map and pick and place sequence to the sequential location of the die on the tape and reel. This is not a true ULT method and thus the accuracy of this prior art method is limited as compared to the various embodiments of the present invention.

During a prior art wafer thinning process, the wafer ID may be removed after the wafer is thinned. Prior art methods that have been used with thin wafers may comprise Unique Pocket Identifier (UPI) methods, where a reel is pre-marked with unique ID's for each pocket and these unique ID's are associated with each die picked from the wafer based on the lot number, wafer ID, and wafer map. The disadvantage of UPI is its relatively lower accuracy comparing to true unique mark on each die and inability for wafer thinning process.

Laser marking tools have been used to create unique ID's for each die as well. The disadvantage of die (or wafer) backside laser marking is its unknown impact to die or wafer strength (especially for thin die or thin wafer), recast formation and surface contamination, unknown reliability impact, and the tendency to be incompatible with back side metal processes. Another prior art method comprises using laser ink on the back of a die, but this method tends to affect reliability of the silicon die/wafer. In some cases, the ink used in prior art laser inking methods may be contaminating, for example, and may contaminate the die through subsequent high temperature processes, and through post washing processes. The various embodiments of the present invention enable reliable, true ULT throughout die prep and the entire assembly process, and improve wafer level traceability as well as die level traceability, without impacting die stress, and without adding contamination.

In an embodiment, wherein a wafer comprises greater than about 700 microns (i.e., it may not have undergone a wafer thinning process) either with or without a back side metallization (BSM), the wafer may be moved to a laser assisted chemical vapor deposition chamber to mark on the backside of each die before a wafer mounting process. In another embodiment, a thinned wafer (less than about 700 microns in thickness) with or without BSM, may be moved to a laser assisted chemical vapor deposition chamber before de-taping of the back-grind tape and wafer mounting processes.

In an embodiment, when wafers do not comprise a BSM, titanium nitride may be used as a good thin metal film due to its stability and good adhesion to a silicon wafer, for example. For wafers with BSM, titanium nitride can still be used even though it has the same color as gold, as long as the deposited mark can be read through a surface depth contrast techniques, as are known in the art, for example. In other cases, metals such as but not limited to aluminum, titanium, and nickel can be used, since they possess a different color from gold, so that the mark can be easily identifiable on the backside of the die/wafer.

Benefits of the various embodiments of the present invention include providing a novel method for marking the backside of a die/wafer for highly accurate ULT purposes throughout die preparation and the entire assembly process. The formation of the identification mark is localized to a focal spot of the laser, thus deposition of a unique marking (instead of removal of material from the backside of the die) on the backside of the die is enabled. These metallic identification markings are constructed by stable and permanent metallic thin films with no damage to the silicon and no impact to the die or wafer strength or reliability performance. Surface residue and/or recast formation is avoided, and the embodiments of the present invention are compatible with back side metallization processes.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that various microelectronic structures are well known in the art. Therefore, the Figures provided herein illustrate only portions of an exemplary microelectronic structure that pertains to the practice of the present invention. Thus the present invention is not limited to the structures described herein.

What is claimed is:

1. A method of forming a microelectronic structure, comprising:

forming an identification mark on a portion of a backside of an individual die of a wafer by utilizing laser assisted chemical vapor deposition, wherein the formation of the identification mark is localized to a focal spot of the laser, and wherein the identification mark comprises a metallic thin film comprising at least one of titanium, aluminum, titanium nitride and copper, and wherein a thickness of the metallic thin film comprises from about 10 nm to about 1 micron.

2. The method of claim 1 further comprising utilizing the identification mark for a unit level traceability process.

3. The method of claim 1 wherein a laser heating effect is localized to the focal spot of the laser, and wherein the laser temperature is below about 200 degrees Celsius.

4. The method of claim 1 wherein the metallic thin film can be formed along at least one pre-defined location on the backside of the individual die.

5. The method of claim 1 wherein the identification mark comprises a contrast region with a backside coating on the backside of the individual die.

6. The method of claim 1 further comprising wherein a set of scanning mirrors guides the laser beam across the backside of the wafer.

7. A method of forming a microelectronic structure, comprising:
   forming a thin metal film on a portion of a backside of an individual die of a wafer by utilizing laser assisted CVD, wherein the formation of the thin metal film is guided by the laser to form a unique identification mark on the individual die; and
   guiding the laser to form additional unique identification markings on additional individual die of the wafer.

8. The method of claim 7 further comprising wherein the unique identification mark does not comprise an ink marking and does not form a groove in the backside of the individual die.

9. The method of claim 7 further comprising wherein the unique identification mark is formed below about 200 degrees Celsius.

10. The method of claim 7 wherein the identification mark is formed on a wafer below about 700 microns in thickness.

11. The method of claim 7 wherein the unique marking comprises a thin metallic film that comprises a contrast region with a backside coating on the backside of the individual die.

* * * * *